United States Patent
Choi et al.

[11] Patent Number: 6,064,596
[45] Date of Patent: May 16, 2000

[54] NONVOLATILE INTEGRATED CIRCUIT MEMORY DEVICES AND METHODS OF OPERATING SAME

[75] Inventors: Ki-Hwan Choi, Seoul; Jong-Min Park, Kyunggi-do, both of Rep. of Korea

[73] Assignee: Samsung Electronics Co., Ltd., Rep. of Korea

[21] Appl. No.: 09/213,722

[22] Filed: Dec. 17, 1998

[30] Foreign Application Priority Data

Dec. 26, 1997 [KR] Rep. of Korea ............. 97-74209
May 30, 1998 [KR] Rep. of Korea ............. 98-20001

[51] Int. Cl.[7] .................................................. G11C 16/00
[52] U.S. Cl. ................................ 365/185.22; 365/185.24
[58] Field of Search ........................ 365/185.29, 185.22, 365/185.11, 185.3, 185.09

[56] References Cited

U.S. PATENT DOCUMENTS

| | | | |
|---|---|---|---|
| 5,138,580 | 8/1992 | Farrugia et al. | 365/185.29 |
| 5,369,615 | 11/1994 | Harari et al. | 365/185.22 |
| 5,418,752 | 5/1995 | Harari et al. | 365/185.29 |
| 5,428,569 | 6/1995 | Kato et al. | 365/185.29 |
| 5,594,689 | 1/1997 | Kato | 365/185.22 |
| 5,621,687 | 4/1997 | Doller | 365/185.29 |
| 5,784,316 | 7/1998 | Hirata | 365/185.29 |
| 5,917,750 | 6/1999 | Miyakawa et al. | 365/185.29 |
| 5,930,173 | 7/1999 | Sekiguchi | 365/185.29 |

*Primary Examiner*—Tan T. Nguyen
*Attorney, Agent, or Firm*—Myers Bigel Sibley & Sajovec

[57] ABSTRACT

An electrically erasable and programmable non-volatile semiconductor memory device and method of erasing the same device are provided. A fail bit counter is provided for the device and method. The fail bit counter counts erase fail bits during the sector erase operation. An erase control circuit selectively terminates the sector erase operation depending upon erase fail bit number.

8 Claims, 5 Drawing Sheets

NONVOLATILE INTEGRATED CIRCUIT MEMORY DEVICES AND METHODS OF OPERATING SAME

FIELD OF THE INVENTION

The present invention relates to electrically erasable and programmable nonvolatile semiconductor memory devices and methods of erasing the same memory devices.

BACKGROUND OF THE INVENTION

Semiconductor memory device for storing data can typically be categorized as either volatile memory devices or non-volatile memory devices. Volatile memory devices lose their stored data when their power supplies are interrupted, in contrast to this, non-volatile memory devices retain their stored data even when their power supplies are interrupted. Thus, non-volatile memory devices are widely used in applications where the possibility of power supply interruption is present.

Conventional non-volatile memory devices include a type of electrically erasable programmable read only memory (EEPROM) device having transistors as memory cells, which is usually referred to as a flash memory device. With reference to FIG. 1, a typical flash memory cell includes spaced source and drain regions 3 and 4 of first conductivity type (e.g., N-type) in a semiconductor substrate or bulk 2 of second conductivity type (e.g., P-type); a channel region at a face of the substrate 2, between the spaced source and drain regions 3 and 4; an electrically floating gate 6 for storing charge carriers when the cell is programmed; and a control gate 8 which overlies the floating gate 6, opposite the channel region. The floating gate 6 is completely surrounded by insulations 7 and 9.

Operation of a flash EEPROM device is typically divided into three modes including programming, erasing and reading.

A flash cell is typically programmed by hot electron injection from its bulk (or substrate) to its floating gate. To induce such an effect, it is necessary to supply the control gate and drain of the cell with program voltages (e.g., about 8–12 V for the control gate, and 5–6 V for the drain) which are higher than read voltages (e.g., 4–5 V for the control gate, and about 1 V for the drain) for reading data out of the cell, with its source and bulk grounded.

During the programming mode, the floating gate accumulates the hot electrons and traps the accumulated electrons. The accumulation of a large quantity of trapped electrons in the floating gate causes the effective threshold voltage of the cell transistor to increase (e.g., about 6–7 V). If this increase is sufficiently large, the cell transistor will remain in a non-conductive state when the read voltages are applied thereto during a read operation. In this programmed state, the cell may be said to be storing a logic 1 ("OFF cell"). Such a programmed state of the cell remains even when power supply is interrupted.

Erasing a flash cell transistor is to remove the charge accumulated in its floating gate. The erase operation of a flash cell can be carried out, for example, by applying a negative high voltage (e.g., about –10 V) to its control gate and an appropriate positive voltage (e.g., 5–6 V) to its bulk, having its source and drain floated. This causes cold electron tunneling (i.e., Fowler-Nordheim tunneling) through the thin insulation (e.g., below 100 Å) between the floating gate and the bulk, leading to a decrease in the threshold voltage of the cell transistor (e.g., 1–3 V). The erase voltages may be applied to the cell until it is erased below a maximum threshold voltage acceptable. Accordingly, if a flash cell has been erased, it will heavily conduct. In this case, the cell may be said to be storing a logic 0 ("ON cell"). Thus, by monitoring the bit line current, the programmed or erased state (i.e., 1 or 0) of the cell can be determined.

Meanwhile, most of the state-of-the-art flash memory devices of high density adopt a segmented cell array architecture. Namely, bulk (i.e., substrate) and cell array are divided into a number of sectors. This architecture causes all of the cells within a sector of, for example, 16 k or 64 k bytes capacity to be erased simultaneously.

In such a sector erase operation, due to threshold uniformity, manufacturing condition, amount of use, temperature, etc., one or more cells within the sector may be erased below a minimum acceptable threshold voltage (e.g., 1V), as shown in FIG. 2. This is because too much charge is removed from the floating gates of the cells, making the cells "depletion-like". The cell erased below the minimum threshold is commonly referred to as being "overerased". An overerased cell may induce a leakage current on its associated bit-line, thereby causing errors when reading other cells on the same bit-line.

One solution to this problem is to repair the overerased cells. The method of curing the overerased cells is an iterative process utilizing overerase verification and low-voltage level programming.

In general, the sector erase operation of flash EEPROM devices is carried out as in the following. First, all of the memory cells within a sector are sequentially programmed to narrow their threshold distribution. All the cells of the sector are then erased at a time (hereinafter referred to as "negative gate bulk erase operation"). Thereafter, repair operation begins with selecting a row (i.e., a word-line) and examining the cells on the selected row one by one along columns (i.e., bit-lines) to determine whether there are overerased cells. This procedure is commonly referred to as overerase verification. In this verification, a cell is identified as overerased when it conducts current in excess of the current expected at the lowest threshold voltage (e.g., 1V). Once identified as overerased, a cell is programmed with low-level repair voltages (e.g., 2–5 V to the control gate, 6–9 V to the drain, and 0 V to the source and bulk). Repair of the remaining cells on other rows is performed in the same fashion.

FIG. 3 is a flowchart of a conventional algorithm for sector erasing of flash memory devices. When a sector erase command is issued at step S100, a sector erasing begins in step S105 by resetting an address counter AC and a pulse counter PC to zero. The address counter AC counts addresses of all the memory cells in a sector to be erased. The pulse counter PC is used to number the negative gate bulk erase operations in a sector erase operation. In step S110, a negative gate bulk erasing is executed, during which the cells have their control gates applied with a negative high voltage (e.g., about –10 V), their bulk applied with an appropriate positive voltage (e.g., 5–6 V), and their sources and drains floated. Thereafter, flow proceeds to step S115, wherein it is sequentially verified whether each of the erased cells has its threshold voltage below a maximum acceptable threshold voltage (e.g., 3V). In this erase verification, gate of the selected cell is supplied with an appropriate positive voltage for a given time such that a data bit of the selected cell is read out. It is then determined whether or not the data bit equals logic 0, that is, the selected cell is an ON cell, at step S120. If so, flow advances to step S125 wherein it is checked whether the address counter AC designates a maximum address ACmax (i.e., the address of the last cell), and if not, flow proceeds to step S135 wherein the pulse counter PC points out a maximum number PCmax of the negative gate bulk erase operations in the sector erase operation. In step S125, if not, flow continues back to step S115 via step S130 wherein the value of address counter AC is increased from AC to AC+1, and if so, flow proceeds to step S150 wherein the sector erasing is terminated, reaching the conclusion that the sector is successfully erased (i.e., "erase pass"). In setp S135, if not, flow continues back to step S110 via step S140 wherein the value of pulse counter PC is increased from PC to PC+1, and if so, the sector erasing is also terminated at step S145, judging the sector not to be erased successfully (i.e., "erase fail").

In the above-described erasing method, however, if there exist one or more defective cells (to lower manufacturing cost as much as possible, for instance, an automatic answering device permits memories used therein to contain defective cells) in the sector, which cannot be erased successfully until a maximum number PCmax of the negative gate bulk erase operations are completed, erase time may increase. Examples of the defective cells include the cells having their drain electrodes open-circuited, or the cells each having its drain and control gate substantially electrically coupled to each other with poor insulation. Upon the completion of the negative gate bulk erase operations, other cells than the defective cells may also be overerased. In addition, such overerased cells may have the erase repair time increased and cause program fail in a series of programming operations in the worst case.

Based on the above, it can be appreciated that there presently exists a need in the art for flash memory devices and sector erasing methods thereof which overcome the above-described disadvantages and shortcomings of the presently available devices and methods.

SUMMARY OF THE INVENTION

An object of the present invention, therefore, is to overcome the problems existing in the prior art non-volatile semiconductor flash memory devices and sector erasing methods thereof, and to provide improved non-volatile flash memory devices and sector erasing methods thereof capable of preventing erase fail due to defective cells.

It is another object of the present invention to provide non-volatile semiconductor flash memory devices and sector erasing methods thereof, which are capable of preventing sector erase time increase due to defective cells.

It is still another object of the present invention to provide non-volatile semiconductor flash memory devices and sector erasing methods thereof, which are capable of preventing erase repair time increase of the cells overerased due to defective cells.

These and other objects, advantages and features of the present invention are provided by electrically erasable and programmable non-volatile semiconductor memory devices which include an array of a plurality of memory cells in rows and columns, an erase control circuit for controlling erasing operations in response to an erase command, and a fail bit counter for counting erase fail bits during the sector erase operation and providing erase fail bit number. The memory cell array is divided into two or more sectors each having at least one memory cell. The erase control circuit selectively terminates the sector erase operation depending upon the erase fail bit number. The erase control circuit determines whether a last output value of the fail bit counter in a first sector erase operation equals that of the counter in a second sector erase operation just preceding the first sector erase operation and terminates the first erase operation when the two values are equal. Alternatively, the erase control circuit determines whether an output value of said fail bit counter is greater than a predetermined reference value and terminates the first sector erase operation when the output value of the counter is greater than the predetermined reference value.

According to another aspect of the present invention, a method for erasing the non-volatile semiconductor memory devices comprising erasing one of the sectors by means of a series of negative gate bulk erase operations, detecting erase fail bits, counting the erase fail bits and generating fail bit number, and terminating the sector erasing depending upon the fail bit number. In a preferred embodiment, the step of terminating the sector erasing comprises checking whether the fail bit number of current sector erase operation equals that of previous sector erase operation, and terminating, if so, the sector erasing. In another preferred embodiment, the step of terminating the sector erasing comprises checking whether the fail bit number equals a first reference number, checking, if so, whether number of the negative gate bulk erase operations equals a second reference number, and terminating, if so, the sector erasing.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings, wherein.

DETAILED DESCRIPTION OF THE PREFERRED EMBODIMENTS

The present invention will now be described more fully hereinafter with reference to the accompanying drawings, in which preferred embodiments of the invention are shown. The present invention relates to improvements in erasing sectors of electrically erasable and programmable non-volatile semiconductor flash memory devices. The following description is presented to enable one of ordinary skill in the art to make and use the invention and is provided in the context of a patent application and its requirements. Various modifications to the preferred embodiments will be readily apparent to those skilled in the art and the generic principles herein may be applied to other embodiments. Thus, the present invention is not limited to the embodiments shown but is to be accorded the widest scope consistent with the principles and features described herein.

Figure 1:
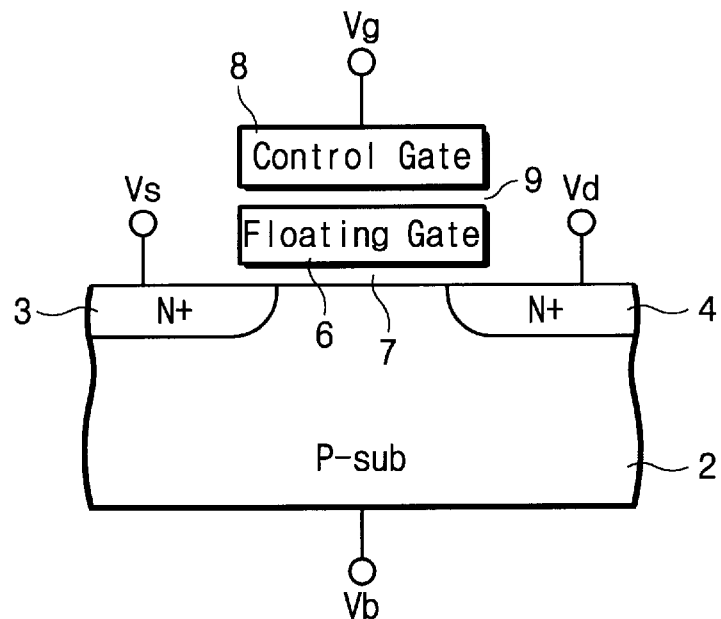
FIG. 1 is a cross sectional view of a typical electrically-erasable and programmable non-volatile semiconductor memory cell.
Figure 2:
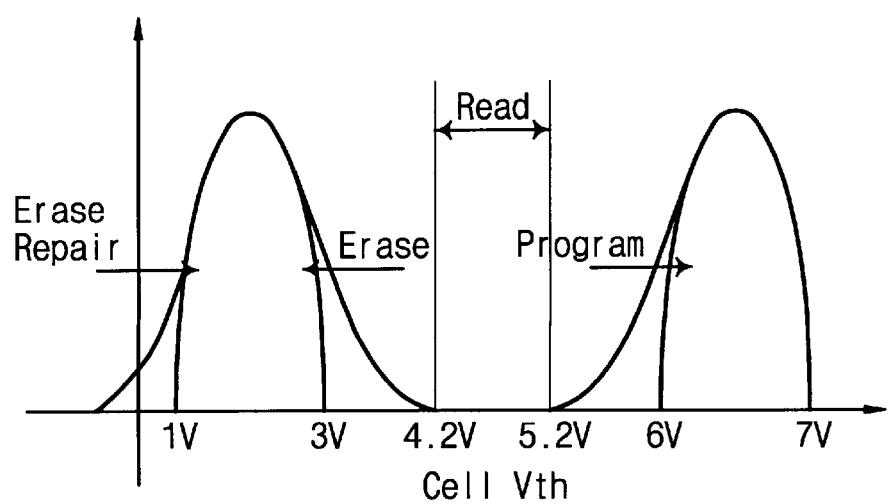
FIG. 2 is a view illustrating an example of threshold voltage distribution.
Figure 3:
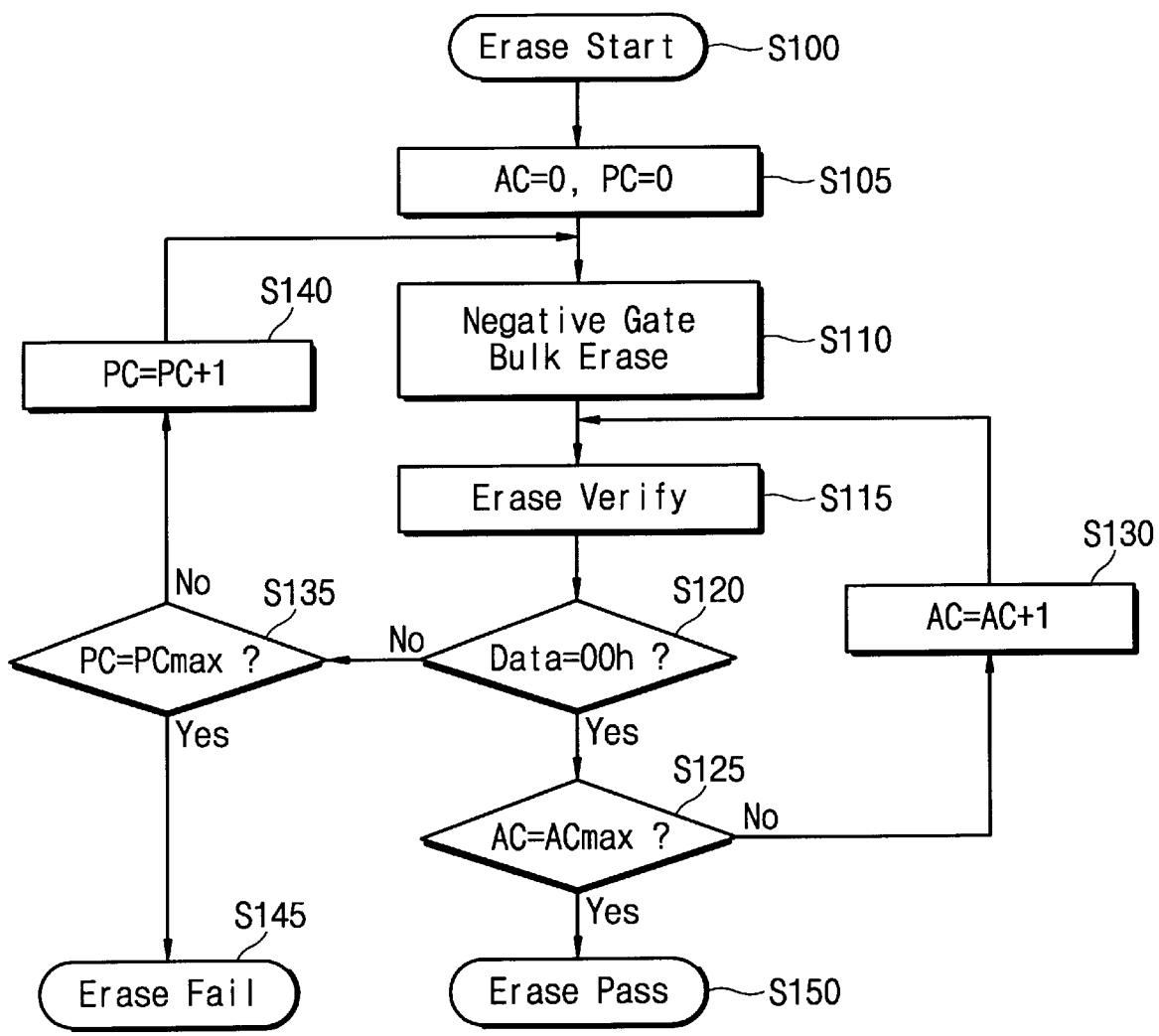
FIG. 3 is a flowchart of a conventional sector erase algorithm for electrically erasable and programmable non-volatile semiconductor flash memory device having the cell structure of FIG. 1.
Figure 4:
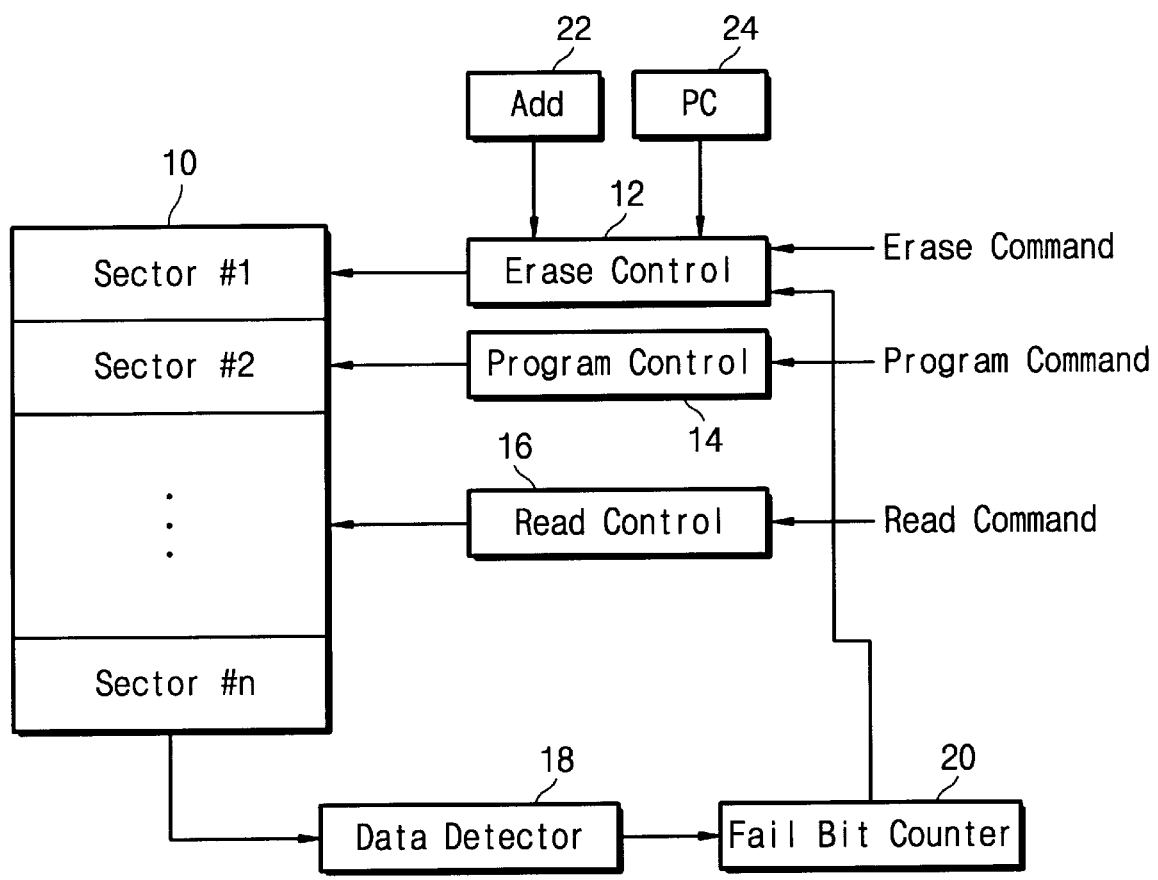
FIG. 4 is a schematic block diagram illustrating an embodiment of an electrically erasable and programmable non-volatile semiconductor flash memory, in accordance with the present invention.

Reference is now made to FIG. 4, which is a schematic block diagram illustrating an electrically erasable and programmable non-volatile semiconductor flash memory device 100 according to the present invention. The memory device 100 includes an array 10 of a plurality of transistors (not shown) arranged in rows and columns as memory cells. Each cell transistor includes spaced source and drain regions of first conductivity type (e.g., N-type) in a semiconductor substrate or bulk of second conductivity type (e.g. P-type), and a channel region at a face of the substrate, between the spaced source and drain regions. The cell transistor further includes an electrically floating gate for storing charge carriers when the cell is programmed, and a control gate which overlies the floating gate, opposite the channel region. The floating gate is completely surrounded by insulation between the channel and the control gate.

The memory cell array 10 is divided into two or more sectors each having at least one memory cell (usually a plurality of cells), although not shown. Memory cells in each sector are erased simultaneously during a sector erase operation. The memory device 100 further includes an erase control circuit 12 for controlling erasing operations in response to an erase command, a program control circuit 14 for controlling programming operations in response to a program command, a read control circuit 16 for controlling reading operations in response to a read command, a data detector 18 for checking whether a read-out data bit equals a logic zero, namely, the selected cell is an ON cell, and a fail bit counter 20 for counting the number of erase fail bits during the sector erase operation.

The fail bit counter 20 increases its value when a data bit read out of a corresponding sector is not equal to the logic zero, that is, when there exists at least one fail bit (or defective cell). The output value of the fail bit counter 20 is sent to the erase control circuit 12 and stored therein. The erase control circuit 12 decides whether or not the last output value of the counter 20 in the current sector erase operation equals that of the counter 20 in the previous sector erase operation and terminates the present erase operation when the two values are equal.

Alternatively, the fail bit counter 20 gives its output value to the erase control circuit 12. The erase control circuit 12 determines if the output value of the counter 20 is greater than a predetermined reference value (for example, 2–5) and terminates the erase operation when the counter output value is greater than the reference value.

Figure 5:
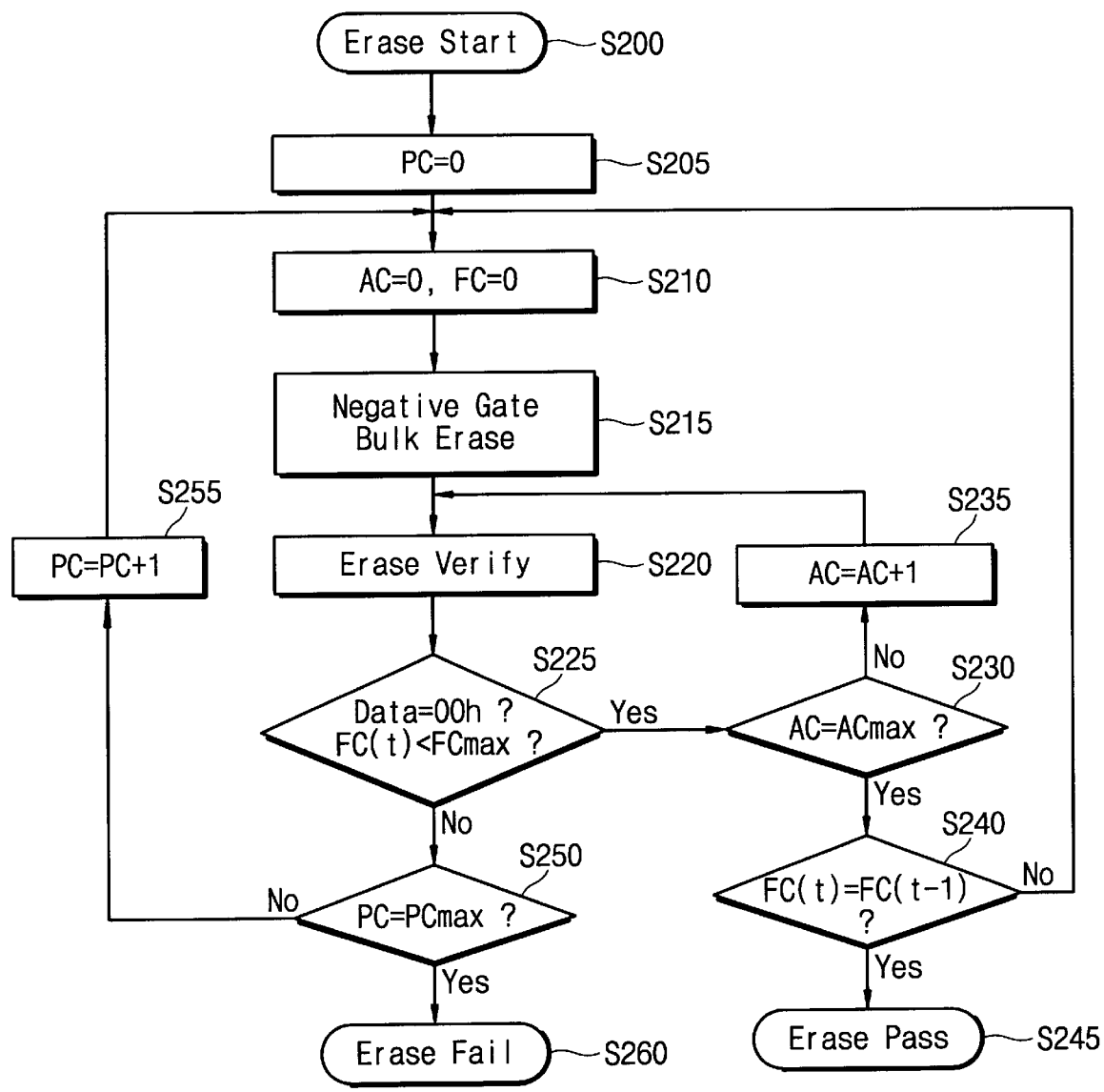
FIG. 5 is a flowchart of an embodiment of a sector erase algorithm for electrically erasable and programmable non-volatile semiconductor flash memory, in accordance with the present invention.

Referring to FIG. 5, there is shown a flowchart of an embodiment of a sector erasing algorithm for electrically erasable and programmable non-volatile semiconductor flash memory devices, in accordance with the present invention.

When a sector erase command is issued at step S200, a sector erasing begins in step S205 by resetting a pulse counter PC to zero. The pulse counter PC is used to number a series of the negative gate bulk erase operations in a sector erase operation.

At step S210, an address counter AC and a fail bit counter FC both are reset. The address counter AC is provided to designate addresses of all the memory cells in a sector to be erased. Thereafter, flow advances to step S215 wherein a negative gate bulk erasing is executed, during which the cells have their control gates applied with a negative high voltage (e.g., about −10 V), their bulk applied with an appropriate positive voltage (e.g., 5–6 V), and their sources and drains floated. The negative gate bulk erase operation is conducted for an appropriate time (e.g., 5 msec) in order to prevent the cells from being overerased.

It is sequentially verified, at step S220, whether each of the erased cells has its threshold voltage below a maximum acceptable threshold voltage (e.g., 3V). In this erase verification, gate of the selected cell is supplied with an appropriate positive voltage (e.g., 3.5V) for a given time (e.g., 300 nsec) such that data of the selected cell is read out.

In step S225, it is determined if the data equal logic 0 (i.e., the selected cell is an OFF cell), or if the current value FC(t) of the fail bit counter FC is less than a given maximum value FCmax (e.g., 2–5) which represents the maximum number of fail bits acceptable in a sector. If so, flow advances to step S230 wherein it is checked whether the address counter AC designates a maximum address ACmax (i.e., the address of the last cell), and if not, flow proceeds to step S250 wherein it is determined if the value of the pulse counter PC is equal to a given maximum number PCmax (e.g., 256) of the negative gate bulk erase operations in the sector erase operation.

At step S230, if not, flow continues back to step S220 via step S235 wherein the value of address counter AC is increased from AC to AC+1, and if so, flow proceeds to step S240 wherein it is checked whether the output value FC(t) of bit fail counter 20 in current sector erase operation equals the value FC(t−1) of the counter 20 in a previous sector erase operation.

If the two values FC(t) and FC(t−1) are not equal in step S240, then flow returns to step S210, and if so, flow advances to step S245 wherein the sector erasing is terminated, reaching the conclusion that the sector is successfully erased (i.e., "erase pass").

At step S250, if not, flow continues back to step S210 via step S255 wherein the value of pulse counter PC is increased from PC to PC+1, and if so, the sector erasing is also terminated in step S260, concluding the selected not to be erased successfully (i.e., "erase fail").

Figure 6:
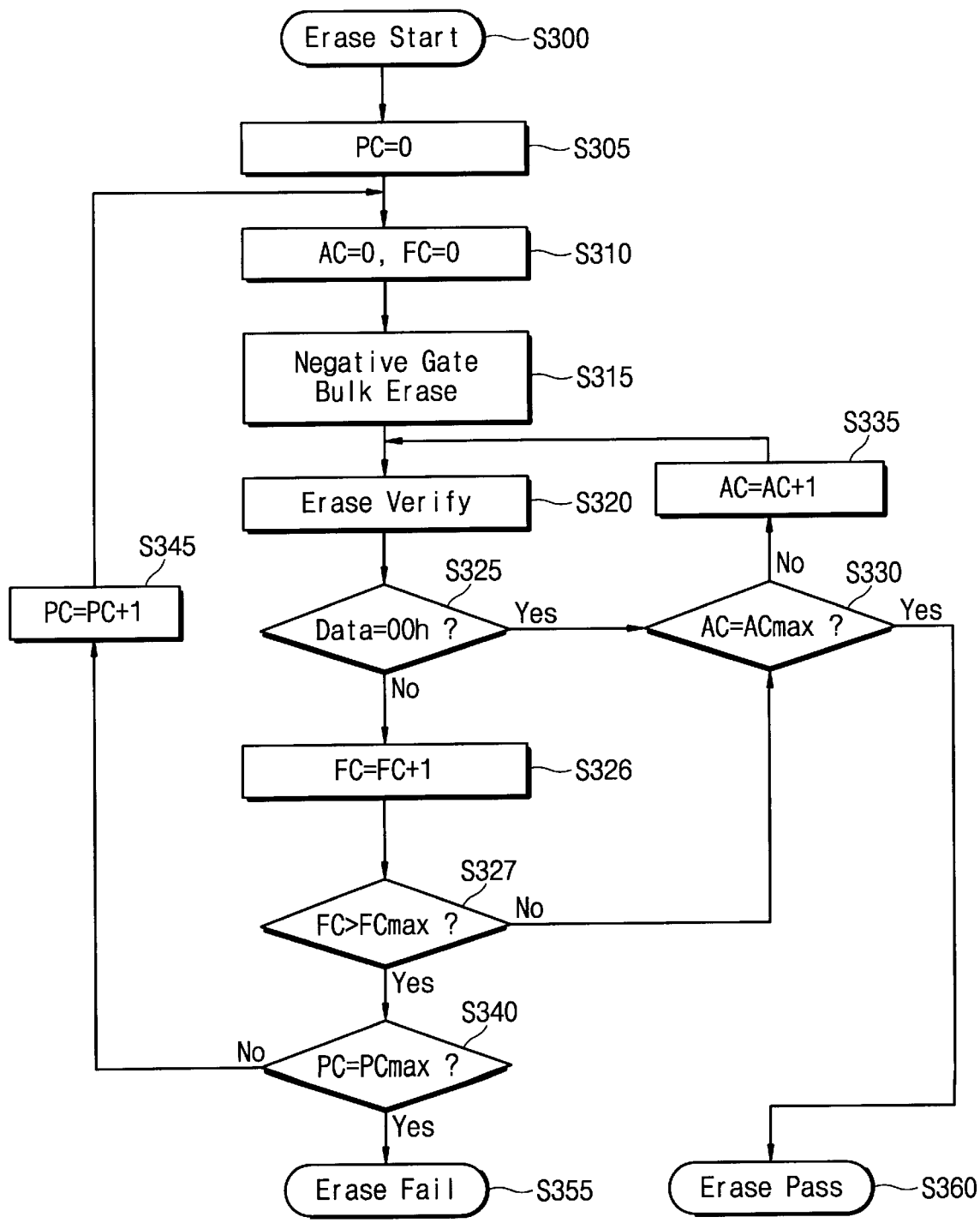
FIG. 6 is a flowchart of another embodiment of a sector erase algorithm for electrically erasable and programmable non-volatile semiconductor flash memory in accordance with the present invention.

FIG. 6 is a flowchart which illustrates another embodiment of a sector erasing algorithm for electrically erasable and programmable non-volatile semiconductor flash memory devices, in accordance with the present invention.

After an issue of sector erase command at step S300, the pulse counter PC is reset to zero in step S305. Subsequently, the address counter AC and the fail bit counter FC both are reset at step S310. Flow then advances to step S315 wherein a negative gate bulk erasing is executed, during which the cells have their control gates applied with a negative high voltage (e.g., about −10 V), their bulk applied with an appropriate positive voltage (e.g., 5–6 V), and their sources and drains floated. The negative gate bulk erase operation is conducted during, for example, 5 milliseconds in order to prevent the cells from being overerased.

It is sequentially verified, at step S320, whether each of the erased cells has its threshold voltage below a maximum threshold voltage (e.g., 3V) acceptable. In this erase verification, gate of the selected cell is supplied with an appropriate positive voltage (e.g., 3.5V) during, for example, 300 nanoseconds so that data of the selected cell is read out.

In step S325, it is determined if the data equal logic 0 (i.e., the selected cell is an ON cell). If so, flow advances to step S330 wherein it is checked whether the address counter AC designates a maximum address ACmax (i.e., the address of the last cell), and if not, the value of fail bit counter FC is increased from FC to FC+1 in step S326 and flow then proceeds to step S327 wherein it is checked if or not the value of the fail bit counter FC equals a given maximum fail bit value FCmax (e.g., 2–5) which represents the maximum number of fail bits acceptable in a sector.

In step 327, if not, flow advances to step S330, and if so, flow proceeds to step S340 wherein it is determined wether the value of the pulse counter PC is equal to a given maximum value PCmax (e.g., 256) of the negative gate bulk erase operations in the sector erase operation.

In step S330, if not, flow continues back to step S320 via step S335 wherein the value of address counter AC is increased from AC to AC+1, and if so, flow proceeds to step S360 wherein the selected sector erasing is terminated, judging that the sector is successfully erased (i.e., "erase pass").

In step S340, if not, flow continues back to step S310 via step S345 wherein the value of pulse counter PC is increased from PC to PC+1, and if so, the sector erasing is also terminated at step S355, concluding that the selected sector is not erased successfully (i.e., "erase fail").

As described above, according to the present invention, sector erase time increase due to defective cells and erase repair time increase of the cells overerased due to defective cells can be prevented. It is also possible to suppress program fail due to defective cells.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A non-volatile semiconductor memory device, comprising:
    an array of a plurality of memory cells in rows and columns, wherein the memory cell array is divided into two or more sectors each having at least one memory cell;
    an erase control circuit for controlling a sector erase operation in response to an erase command;
    a program control circuit for controlling programming operations in response to a program command;
    a read control circuit for controlling reading operation in response to a read command; and
    a fail bit counter for counting erase fail bits during the sector erase operation and providing erase fail bit number;
    wherein said erase control circuit selectively terminates the sector erase operation depending upon the erase fail bit number, determines whether a last output value of said fail bit counter in a first sector erase operation equals that of said counter in a sector erase operation just preceding the first sector erase operation and terminates the first erase operation when the two values are equal.

2. The memory device according to claim 1, wherein said erase control circuit determines whether an output value of said fail bit counter is greater than a predetermined reference value and terminates the first sector erase operation when the output value of said counter is greater than the predetermined reference value.

3. The memory device according to claim 2, wherein said predetermined reference value ranges from 2 to 5.

4. A method for erasing a non-volatile semiconductor memory device having an array of a plurality of memory cells, wherein said memory cell array is divided into two or more sectors and each sector has at least one memory cell, said method comprising the steps of:
    erasing one of said sectors by means of a series of negative gate bulk erase operations;
    detecting erase fail bits;
    counting said erase fail bits and generating fail bit number; and
    checking whether the fail bit number of a current sector erase operation equals that of a previous sector erase operation and terminating said sector erasing if the fail bit number of the current sector erase operation equals that of the previous sector erase operation.

5. The method according to claim 4, wherein said step of terminating said sector erasing comprises checking whether said fail bit number equals a first reference number, checking, if so, whether number of said negative gate bulk erase operations equals a second reference number, and terminating, if so, said sector erasing.

6. The method according to claim 5, wherein said first reference number ranges from 2 to 5.

7. A method for erasing a non-volatile semiconductor memory device, wherein said memory device includes an array of a plurality of memory cells in rows and columns, wherein the memory cell array is divided into two or more sectors each having at least one memory cell, a first counter for counting address, a second counter for counting number of erase fail bits and generating fail bit number, and a third counter for counting number of sector erasing operations and providing sector erase operation number; said method comprising steps of:
    (a) resetting said first and second counters;
    (b) erasing one of said sectors and verifying said erased sector;
    (c) checking whether a selected cell is an OFF cell, or whether a current value of said second counter is less than a first reference value which represents a maximum number of fail bits acceptable;
    (d) checking, if so at the step (c), whether the first counter designates a maximum address;
    (e) increasing, if not at the step (d), said first counter and repeating the step (b);
    (f) checking, if so at the step (d), whether the fail bit number of current sector erase operation equals that of previous sector erase operation;
    (g) repeating, if not at the step (f), the step (a); and
    (h) verifying, if so at the step (f), erase pass and terminating the erasing operation.

8. The method of claim 7 further comprising steps of:
    (i) checking, if not at the step (c), whether the sector erase operation number equals a second reference number;
    (j) increasing, if not at the step (i), said third counter and repeating the step (a); and
    (k) verifying, if so at step (i), erase fail and terminating the erasing operation.

* * * * *